US005990816A

United States Patent [19]

Kramer et al.

[11] Patent Number: 5,990,816

[45] Date of Patent: Nov. 23, 1999

[54] DIGITAL-TO-ANALOG CURRENT CONVERTER EMPLOYING FLOATING GATE MOS TRANSISTORS

[75] Inventors: Alan Kramer, Berkeley, Calif.; Roberto Canegallo, Tortona, Italy; Mauro Chinosi, Cologno Monzese, Italy; Giovanni Gozzini, Palazzolo S/O, Italy; Philip Leong, Shatin, The Hong Kong Special Administrative Region of the People's Republic of China; Pier Luigi Rolandi, Monleale, Italy; Marco Sabatini, Agrate Brianza, Italy

[73] Assignee: STMicroelectronics S.r.l., Agrate Brianza, Italy

[21] Appl. No.: 08/940,803

[22] Filed: Sep. 30, 1997

[30] Foreign Application Priority Data

Sep. 30, 1996 [EP] European Pat. Off. .............. 96830490

[51] Int. Cl.$^{6}$ ...................... H03M 1/00

[52] U.S. Cl. ...................... 341/136

[58] Field of Search ...................... 341/133, 136, 341/153

[56] References Cited

U.S. PATENT DOCUMENTS 4,594,577 6/1986 Mao ........................ 341/136
4,667,178 5/1987 Ryu ........................ 341/136
5,376,935 12/1994 Seligson ........................ 341/136
5,394,359 2/1995 Kowalski ........................ 365/185

FOREIGN PATENT DOCUMENTS 56-021415 2/1981 Japan .

OTHER PUBLICATIONS

Kramer et al., "Flash–Based Programmable Nonlinear Capacitor for Switched–Capacitor Implementations of Neural Networks," in Technical Digest of the International Electron Devices Meeting, IEEE, San Francisco, Dec. 11–14, 1994, pp. 449–452.

*Primary Examiner*—Michael Tokar
*Assistant Examiner*—Auh Tran
*Attorney, Agent, or Firm*—David V. Carlson; Seed and Berry LLP

[57] ABSTRACT

The present invention relates to a digital-to-analog converter having a plurality of inputs for digital signals and an output for an analog signal. It comprises a current amplification circuit having an input and an output coupled to the converter output, and a plurality of floating gate MOS transistors corresponding to the plurality of converter inputs and having their source terminals coupled together and to a first reference of potential. The converter has drain terminals coupled together and to the input of the amplification circuit, and has control terminals coupleable, under control from the inputs of the plurality, to different references of potential having selected fixed values.

16 Claims, 3 Drawing Sheets

DIGITAL-TO-ANALOG CURRENT CONVERTER EMPLOYING FLOATING GATE MOS TRANSISTORS

TECHNICAL FIELD

The present invention relates to a digital-to-analog converter having a plurality of inputs for digital signals and an output for an analog signal.

BACKGROUND OF THE INVENTION

Digital-to-analog converters are widely used in the field of circuit electronics and are implemented with either discrete or integrated elements. Abundant literature is available on the subject.

From U.S. Pat. No. 5,376,935, which is hereby incorporated by reference, a digital-to-analog converter is known, which includes a plurality of electrically programmable floating gate transistors, each having an electrically programmable threshold voltage. Each of the transistors in the converter has its source coupled to ground, its control gate coupled to an output node, and its drain coupled to the output node via one of a plurality of switching circuits. The output node is coupled to a voltage source via a load circuit. An input circuit decodes a digital input signal to selectively generate one of a plurality of control signals at a given time in accordance with a digital input signal. Each of the control signals is for one of the switching circuits. When a transistor is coupled to the output node, the voltage level of the output node is equal to the threshold voltage of that transistor.

SUMMARY OF THE INVENTION

It is an object of the invention, to provide a circuit which can be readily integrated and programmed and exhibits good accuracy. The object is achieved by a digital-to-analog converter comprising a current amplification circuit having at least one input and an output coupled to the converter output and a plurality of floating gate MOS transistors corresponding to said plurality of converter inputs and having their source terminals coupled together and to a first reference of potential, their drain terminals coupled together and to at least one input of that amplification circuit and control terminals, which can be, under control of the inputs for digital signals, coupled to different references of potential having selected fixed values.

By using a plurality of floating gate MOS transistors whose threshold voltage is programmable, as is well known, and which can be activated by the inputs of the converter and of a current amplification circuit to which the transistors are connected, a circuit can be provided which is readily integratable using MOS or mixed technology, is programmable, and exhibits an accuracy which can be well controlled, also on account of the transistor programmability.

BRIEF DESCRIPTION OF THE DRAWINGS

The invention will be more clearly apparent from the following description of an embodiment of the invention, to be read in conjunction with the accompanying drawings.

DETAILED DESCRIPTION OF THE INVENTION

As is known, floating gate MOS transistors are MOS transistors wherein, in the channel area beneath the control or gate terminal, another gate is provided which is isolated from the former and the channel. The threshold voltage of such transistors depends on the amount of charge present at their floating gate. Several ways of programming these transistors, that is of injecting/extracting charge into/from the floating gate, are known from the literature. In view of the widespread utilization of these transistors in semiconductor digital storage circuits, e.g., of the UV_EPROM, EEPROM, FLASH_EPROM types, reference can be had to the abundant literature on the subject for any enlightenment on technology and circuit design.

Figure 1:
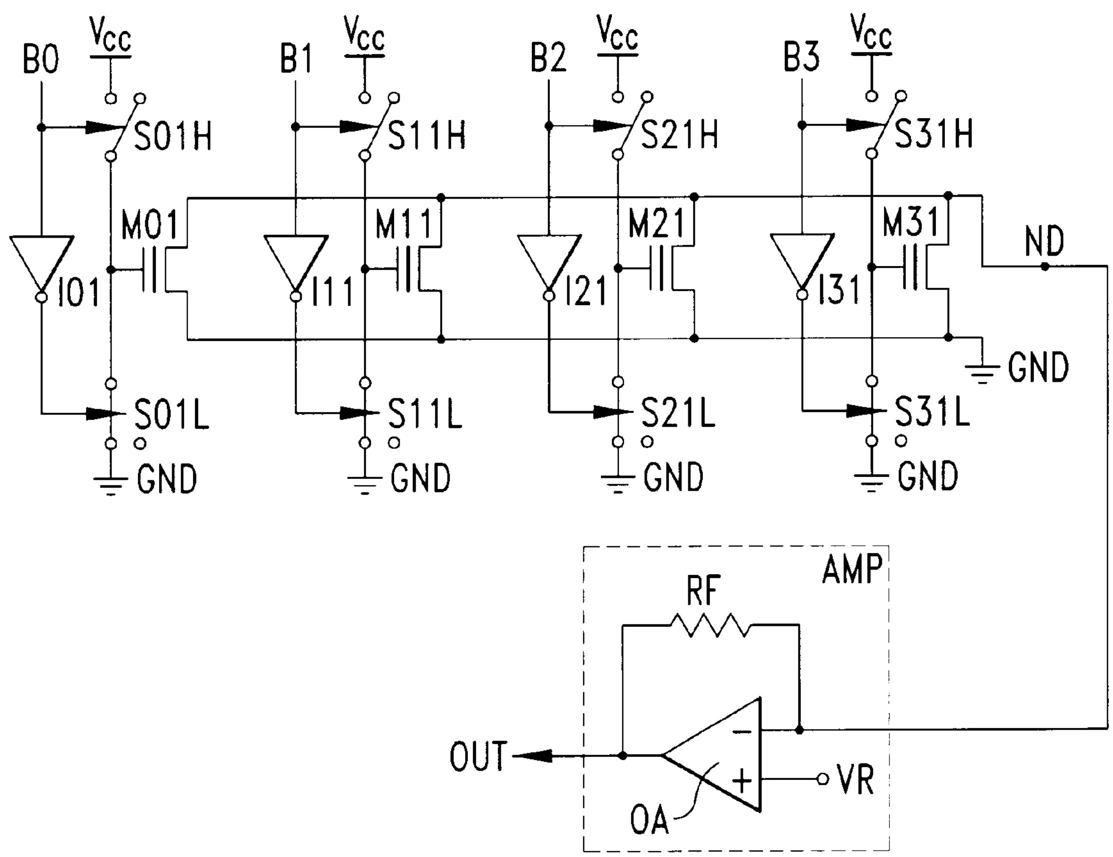
FIG. 1 is a circuit diagram of a converter according to the invention.

Referring to FIG. 1, an embodiment of a digital-to-analog converter of this invention is shown, which has plural inputs B0, B1, B2, B3 for accepting digital signals, and one output OUT for an analog signal. The converter comprises a current amplification circuit AMP having at least one input ND and an output coupled to the converter output and a plurality of floating gate MOS transistors M01, M11, M21, M31 corresponding to the set of inputs B0, B1, B2, B3 of the converter and having their source terminals coupled together and to a first reference voltage, in particular the ground GND, drain terminals coupled together and to the input ND of the amplification circuit AMP, and control terminals coupleable, under control from the inputs B0, B1, B2, B3 to different reference voltages having selected fixed values.

The current amplification circuit AMP of this embodiment comprises, as shown in FIG. 1, an operational amplifier OA having its non-inverting (+) input connected to a voltage reference VR which may have an intermediate value to the ground GND and the power supply VCC, and a feedback resistor RF connected between the output of the amplifier OA and its own inverting input (–), the output of the amplifier OA being also connected to the output of the circuit AMP, that is to the converter output OUT.

For simplicity, all the control terminals may be coupleable alternatively to a second reference voltage, specifically the ground GND, or to a third reference voltage, specifically the power supply VCC. This can be achieved, as shown in FIG. 1, by connecting, between the control terminal of the transistor M01 and the supply VCC, a controlled switch S01H, e.g., a traditional type of MOS transistor, and between it and the ground, a controlled switch S01L, e.g., also a traditional type of MOS transistor. The input B0 could control the switch S01H directly, and the switch S01L through an inverter I31, for example. The same holds for the transistors M11, M21, M31, the inverters I11, I21, I31, and the switches S11H, S11L, S21H, S21L, S31H, S31L.

However, if the logic levels being supplied to the inputs B0, B1, B2, B3 already correspond naturally to the values of potential of the second and third references, these inputs may be connected directly to the control terminals of the floating gate MOS transistors. In this case, the two references of potential are, in a sense, external to the converter.

In operation, all the control terminals are at first coupled to the second reference, the ground GND in FIG. 1. Thus, the drain current developed by all the MOS transistors will be zero because the gate-source voltage is below their threshold voltage, and zero will be the converter output OUT as well. Subsequently in operation, the control terminals of the transistors that correspond to inputs at an active logic state are coupled to the third reference, the supply VCC in FIG. 1, and the control terminals of the transistors that correspond to inputs at an inactive logic state remain coupled to the second reference. In this way, some MOS transistors will develop currents which, once added to the input ND and amplified by the circuit AMP, will produce at the output OUT an analog signal whose width is tied to the digital signals to the inputs B0, B1, B2, B3.

Figure 2:
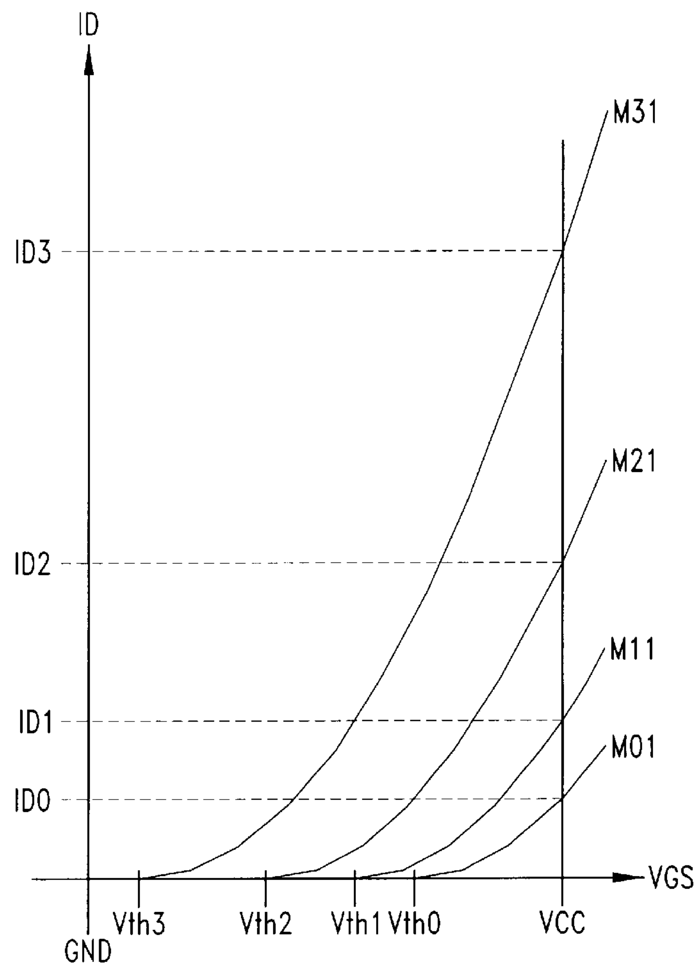
FIG. 2 illustrates possible characteristics of gate-source voltage vs. drain current of the floating gate MOS transistors in the circuit of FIG. 1.

It often occurs that the inputs of a digital-to-analog converter must have different weights from the output, which weights are typically tied to powers of two. In this case, the value of the threshold voltage of one transistor, e.g., M21, in the set that corresponds to one input, e.g., B2, is such that, for a given gate-source voltage, its drain current is substantially twice as large as the drain current of the transistor M11 corresponding to the next lower weight input B1. This is clearly illustrated by FIG. 2, where plots of gate-source voltage VGS vs. drain current ID show possible characteristics of the transistors M01, M11, M21, M31 in a saturated, and hence parabolic, condition, along with their respective threshold voltages Vth0, Vth1, Vth2, Vth3 and drain currents ID0, ID1, ID2, ID3 at a gate-source voltage equal to the supply voltage VCC.

A circuit of this type is easy to implement in the integrated form, both alone and in combination with further circuitry, as shown best in FIG. 1. It is highly versatile in that the type of the conversion is dictated by the values of the threshold voltages of the floating gate MOS transistors, which can be readily changed by "programming". It is accurate because, especially in the integrated implementation, the performance of the MOS transistors is nearly the same, and almost any type of errors can be corrected by acting on the threshold voltage values.

A further advantage, namely compensation for temperature variations and charge leakage from the floating gates, for example, can be provided by the circuit embodiment discussed below.

Figure 3:
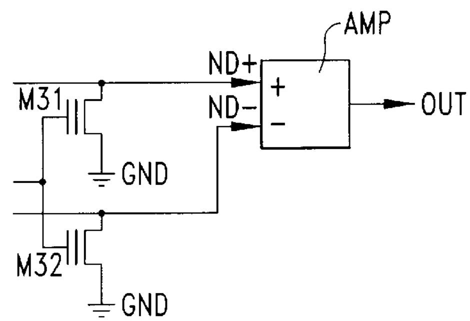
FIG. 3 is a detail view of a modified embodiment of the circuit in FIG. 1.

Referring to FIGS. 1 and 3, a converter according to this embodiment comprises an additional plurality of floating gate MOS transistors M02, M12, M22, M32 corresponding to the first M01, M11, M21, M31 and having their source terminals coupled together and to the first reference voltage, the ground GND in the example of FIG. 3. Their drain terminals are also coupled together and to inputs ND+ and ND− of the circuit AMP, such that the current contributed by this additional plurality of transistors is opposite in sign from the first transistor plurality. Finally, the converter has control terminals coupleable, under control by the inputs, to the second and third references, the ground GND and supply VCC, respectively, in the example of FIG. 3.

Only the last transistor M31 in the first plurality and last transistor M32 in the additional plurality are shown in FIG. 3. In this case, the circuit AMP is slightly different from the instance of FIG. 1, and has two inputs, a non-inverting input ND+ nd inverting input ND−. The drain terminals of the first plurality of transistors are, in this example, connected to the input ND+, and the drain terminals of the additional plurality of transistors are connected to the input ND−. The control terminals are connected together in pairs, that is, the control terminal of transistor M31 is paired with the control terminal of transistor M32, and so forth, so that the inputs will have the same effect on the corresponding transistors in the two sets. The circuit AMP supplies on the output OUT a signal whose width corresponds to the amplification of the current differential at its inputs.

Figure 4:
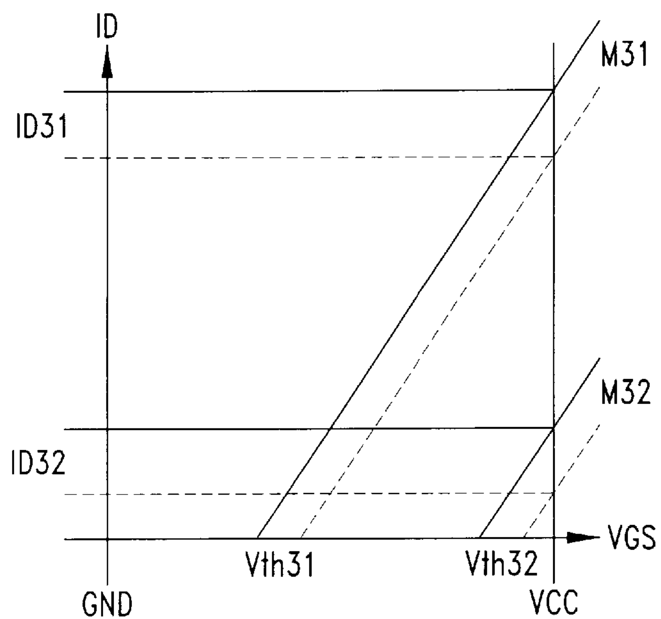
FIG. 4 illustrates possible characteristics of gate-source voltage vs. drain current of the MOS transistors in the circuit of FIG. 3.

Shown in FIG. 4 is a plot of gate-source voltage VGS vs. drain current ID illustrating possible characteristics of the transistors M31 and M32 in the linear or straight condition, along with their respective threshold voltages Vth31 and Vth32, and respective drain currents ID31 and ID32 at a voltage VGS equal to the supply voltage VCC.

The activation of the transistor pair M31, M32 by the corresponding input B3 has a contribution on the output OUT which is proportional to the difference between ID31 and ID32. It can be seen that any changes in the voltage VGS and the threshold voltages Vth31 and Vth32 will, so long as equal in magnitude, bear no influence on this contribution. Among the possible sources of changes to the threshold voltages are temperature variations and charge leakage from the floating gates; in addition, any perturbation on either lines connecting the drain terminals to the inputs of the circuit AMP would be suppressed likewise.

To maximize the above advantages, it is necessary that all the transistors, M01, M11, M21, M31, M02, M12, M22, M32 in this example, of both pluralities operate within the linear range, and accordingly, that their characteristics be straight lines. As is known, this occurs if the drain-source voltages VDS of all the transistors are lower than the minimum difference between the voltages VGS and the voltages Vth, e.g., of 100 mV. This condition is to be ensured by the circuit AMP.

Figure 5:
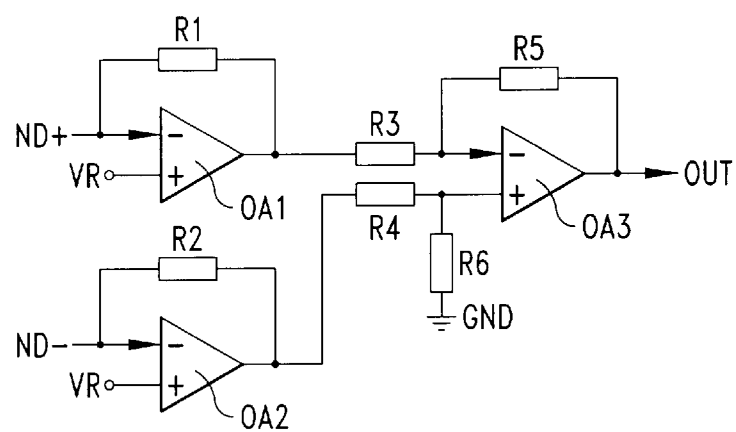
FIG. 5 shows an embodiment of the current amplification circuit in FIG. 3.

A circuit-wise implementation of the circuit AMP in FIG. 3 which meets these requirements is shown in FIG. 5. It comprises an operational amplifier OA1 having an inverting input connected to the input ND+, a non-inverting input connected to a reference of potential, VR, and a resistor R1 connected in negative feedback relationship between the output of the amplifier OA1 and its inverting input. It also includes an operational amplifier OA2 having an inverting input connected to the input ND−, a non-inverting input connected to a reference of potential, VR, and a resistor R2 connected in negative feedback relationship between the output of the amplifier OA2 and its inverting input. Finally, the circuit includes an operational amplifier OA3 having an inverting input connected to the output of the amplifier OA1 through a resistor R3, a non-inverting input connected to the output of the amplifier OA2 through a resistor R4, a resistor R5 connected in negative feedback relationship between the output of the amplifier OA3 and its inverting input, and a resistor R6 connected between its non-inverting input and the ground GND.

As is known, the potential at the inverting inputs of the amplifiers OA1 and OA2 is the same as at their non-inverting inputs, namely VR. To provide a voltage VDS of 100 mV for the MOS transistors of both pluralities, it will suffice, therefore, that this value of potential be selected for the reference VR.

A suitable simple choice for the values of the threshold voltages of the transistors M02, M12, M22, M32 is the following: all substantially identical, higher than the maximum value of the threshold voltages of the transistors M01, M11, M21, M31 of the first plurality, and lower than the value of the third reference, the supply VCC in this example.

It will be possible, of course, to select the value of the threshold voltage of each transistor of the first plurality such that, for a given gate-source voltage, its drain current is substantially twice as large as the drain current of the transistor in the first plurality that corresponds to the next lower input, but both drain currents should be considered as reduced by the drain current of the corresponding MOS transistor in the other plurality.

The operation of the converter in FIG. 3 is similar to that illustrated by FIG. 1. At an initial stage of its operation, the control terminals of the transistors of both pluralities are all coupled to the second reference voltage, and at a subsequent stage of its operation, the control terminals of the corresponding transistors to inputs at the active logic state are coupled to the third reference voltage, and the control terminals of the corresponding transistors to inputs at the inactive logic state remain coupled to the second reference voltage.

As previously mentioned, the floating gate MOS transistors can be programmed. For the converter to provide this feature, it is necessary that it also includes program circuitry for the floating gate MOS transistors which can controllably uncouple them from one another and from the amplification circuit, and couple them to references of program potential.

The present invention is, of course, likely to have various alterations, modifications, and improvements, which are readily apparent to a person skilled in the art. Any such alterations, modifications and improvements are intended to be part of the disclosure and to be within the spirit and scope of the present invention. The number of floating gate MOS transistors and corresponding digital signal inputs, for example, is not limited to four. The skilled person may choose any suitable number of elements. Accordingly, the foregoing description is only by way of example and not intended to be limiting. The present invention is only limited by the enclosed claims and equivalencies thereof.

We claim:

1. A digital-to-analog converter having a plurality of inputs for digital signals and an output for an analog signal, comprising:

a current amplification circuit having at least one input and an output coupled to the converter output; and a plurality of floating gate MOS transistors corresponding to said plurality of converter inputs and having their source terminals coupled together and to a first reference voltage, their drain terminals coupled together and to said at least one input of said amplification circuit, and their control terminals coupleable under control of said inputs for digital signals, to different reference voltages having selected fixed values.

2. The converter according to claim 1, wherein said different reference voltages correspond to second and third reference voltages, wherein the values of said first and second reference voltages correspond to the ground potential, and the value of said third reference voltage corresponds to the supply potential.

3. The converter according to claim 1 wherein the value of the threshold voltage of one transistor in said plurality corresponding to one input is such that, for a given gate-source voltage, its drain current is substantially twice as large as the drain current of the transistor corresponding to the next lower weight input.

4. The converter according to claim 1, further comprising another plurality of floating gate MOS transistors corresponding to the first plurality and having source terminals all coupled together and to the first reference voltage, drain terminals all coupled together and to inputs of the amplification circuit such that the current contributed by the transistors of said another plurality is opposite in sign from the transistors of said first plurality, and control terminals which are coupleable, under control by the inputs of said plurality, to the second and third reference voltages.

5. The converter according to claim 4, wherein said amplification circuit operates all of the MOS transistors in the linear range.

6. The converter according to claim 4 wherein the values of the threshold voltages of the transistors in said another plurality are all substantially identical, and higher than the maximum value of the threshold voltages of the transistors in said first plurality, and lower than the value of said third reference voltage.

7. The converter according to claim 1 wherein, at an initial stage of its operation, all the control terminals are coupled to a second reference voltage, and at a subsequent stage of its operation, the control terminals of the transistors corresponding to inputs at the active logic state are coupled to a third reference voltage and the control terminals of the transistors corresponding to inputs at the inactive logic state remain coupled to the second voltage.

8. The converter according to claim 1, further comprising program circuitry for the floating gate MOS transistors operative to controllably uncouple the floating gate MOS transistors from one another and from the inputs of the amplification circuit and to couple the floating gate MOS transistors to program voltages.

9. A digital-to-analog converter comprising:

a first digital signal input for accepting a first digital signal representing either a logic active or inactive state;

a second digital signal input for accepting a second digital signal representing either a logic active or inactive state;

a first floating gate MOS transistor controlled by said first digital signal, the first transistor having a drain current of a first fixed value if the first digital signal represents a logic active state;

a second floating gate MOS transistor controlled by said second digital signal, the second transistor having a drain current of a second fixed value if the second digital signal represents a logic active state; and an output circuit coupled to the drain terminals of said first and second MOS transistors and outputting an analog output signal corresponding to the combined drain currents of said first and second MOS transistors.

10. The converter of claim 9 wherein the threshold voltages of said first and second MOS transistors are selected such that, at a given gate-source-voltage, the drain current of said second MOS transistor is substantially twice as large as the drain current of said first MOS transistor.

11. The converter of claim 9 wherein the source terminals of said first and second MOS transistors are coupled to a first voltage, the control terminals of said first and second MOS transistors are coupled to a second voltage if the first and second digital signals represent a logic inactive state, respectively, and the control terminals of said first and second MOS transistors are connected to a third voltage if the first and second digital signals represent a logic active state, respectively.

12. The converter of claim 9 wherein said output circuit comprises an operational amplifier, a non-inverting input of which is connected to a reference voltage, an inverting input of which is connected to the drain terminals of said first and second MOS transistors and, via a feedback resistor, to an output terminal of the operational amplifier.

13. The converter of claim 9 further comprising:

a third and fourth MOS transistor controlled by said first and second digital signal inputs, respectively, having a drain current smaller than said first and second fixed value if a signal representing a logic active state is received at the first and second digital signal inputs, respectively;

wherein the output circuit outputs an analog signal corresponding to the difference between the combined drain currents of said first and second MOS transistors and the combined drain currents of said third and fourth MOS transistors.

14. The converter of claim 13 wherein said first, second, third, and fourth MOS transistors operate in their linear range.

15. The converter of claim 13 wherein the threshold voltages of said third and fourth MOS transistors are substantially equal to each other and higher than the threshold voltages of said first and second MOS transistors.

16. The converter of claim 13 wherein the third and fourth MOS transistors are floating gate MOS transistors with programmable threshold voltages.

* * * * *